DEFENSIVE PUBLICATION

UNITED STATES PATENT AND TRADEMARK OFFICE

Published at the request of the applicant or owner in accordance with the Notice of Dec. 16, 1969, 869 O.G. 687. The abstracts of Defensive Publication applications are identified by distinctly numbered series and are arranged chronologically. The heading of each abstract indicates the number of pages of specification, including claims and sheets of drawings contained in the application as originally filed. The files of these applications are available to the public for inspection and reproduction may be purchased for 30 cents a sheet.

Defensive Publication applications have not been examined as to the merits of alleged invention. The Patent and Trademark Office makes no assertion as to the novelty of the disclosed subject matter.

PUBLISHED OCTOBER 5, 1976

951 O.G. 8

T951,003

CRYSTALLOGRAPHIC ORIENTATION OF MONOCRYSTALLINE SUBSTRATE NEAR THE (100) PLANE FOR EPITAXIAL GROWTH

Joseph Regh, 25 Marion Ave.,
Wappingers Falls, N.Y. 12590

Continuation of abandoned application Ser. No. 430,285, Jan. 2, 1974. This application Nov. 7, 1975, Ser. No. 629,750

Int. Cl.[2] B05D 5/12
U.S. Cl. 156—612
1 Sheet Drawing. 17 Pages Specification

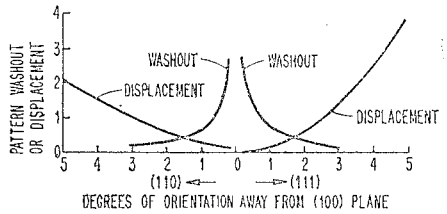

FIG. 7 shows the relationship of washout and pattern displacement for an epitaxial temperature of 1100° C. at a growth rate of 0.5 micron/minute. The numeral 4 represents the most severe case of pattern washout or pattern displacement depending on the curve while the numeral 0 represents the asbence of pattern washout or pattern displacement depending on the curve.

This shows the pattern washout for a surface of a wafer oriented from the (100) plan towards the nearest (111) plane and a surface of a wafer oriented from the (100) plane toward the nearest (110) plane. The curves disclose that there is less effect on displacement when the orientation of the wafer surface on which the epitaxial layer is deposited is towards the nearest (110) plane. Since the pattern washout is substantially similar in either direction, the desired angle of the surface or face of the wafer or substrate relative to the (100) crystallographic plane would be towards the nearest (110) plane when it is desired to eliminate pattern displacement as well as pattern washout.

To prevent pattern washout, an epitaxial layer is deposited on a face of a monocrystalline substrate of silicon having the face cut at an angle in the range of 0.5° to 5° to the (100) plane.

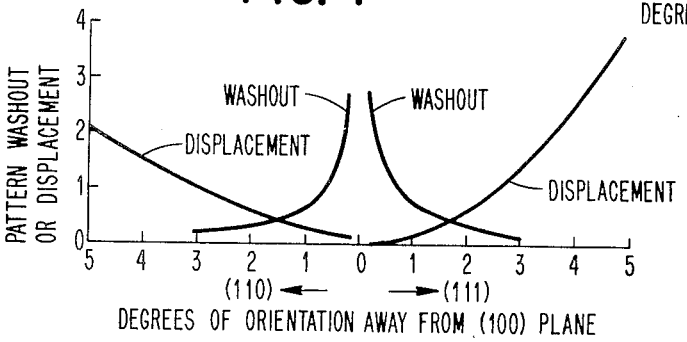

CRYSTALLOGRAPHIC ORIENTATION OF MONO-CRYSTALLINE SUBSTRATE NEAR THE (100) PLANE FOR EPITAXIAL GROWTH
Original Filed Nov. 7, 1975
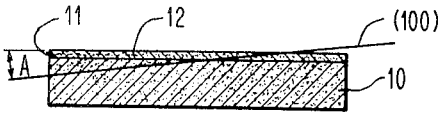
FIG. 1
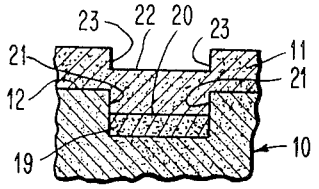
FIG. 3
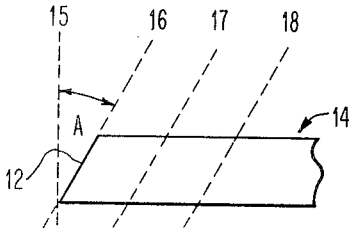
FIG. 2
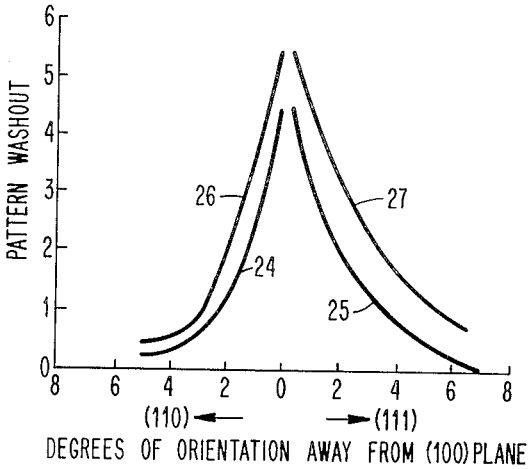
FIG. 5
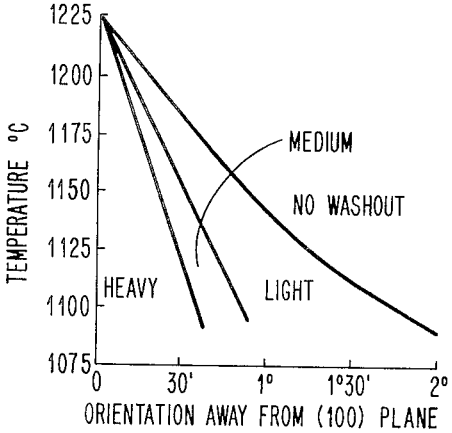
FIG. 4
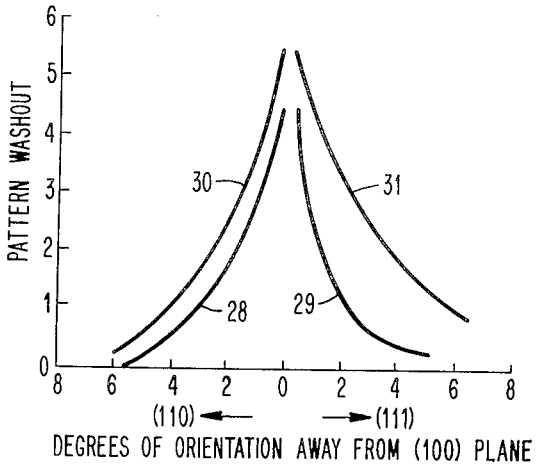
FIG. 6
FIG. 7